(12) United States Patent
Lake

(10) Patent No.: US 7,648,856 B2
(45) Date of Patent: Jan. 19, 2010

(54) METHODS FOR ATTACHING MICROFEATURE DIES TO EXTERNAL DEVICES

(75) Inventor: Rick C. Lake, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 11/511,781

(22) Filed: Aug. 28, 2006

(65) Prior Publication Data

US 2008/0050904 A1 Feb. 28, 2008

(51) Int. Cl.
*H01L 21/00* (2006.01)
*H01L 21/44* (2006.01)

(52) U.S. Cl. .................. 438/108; 257/678; 257/684; 257/687; 257/E23.023; 257/E23.026; 438/106; 438/455; 438/612; 174/260

(58) Field of Classification Search ......... 438/612–617, 438/106–112, 118, 119, 127, 455; 174/260, 174/678, 684, 687, E23.023, E23.026
See application file for complete search history.

(56) References Cited

U.S. PATENT DOCUMENTS 6,787,917 B2 * 9/2004 Lee et al. .................... 257/777
6,897,565 B2 * 5/2005 Pflughaupt et al. .......... 257/777
2005/0029667 A1 * 2/2005 Yamashita et al. .......... 257/772
2006/0081583 A1 * 4/2006 Hembree et al. ............ 219/209

FOREIGN PATENT DOCUMENTS

WO   WO-9109699   *  7/1991

* cited by examiner

*Primary Examiner*—Alexander G Ghyka
*Assistant Examiner*—Leonard Chang
(74) *Attorney, Agent, or Firm*—Perkins Coie LLP

(57) ABSTRACT

Methods for attaching microfeature dies to external devices are disclosed. The external devices can include other microfeature dies, support members or other suitable devices. A particular method includes attaching the solder to the at least one of the microfeature die in the support member by changing a phase of the solder. The method can further include contacting the solder with the other of the microfeature die and the support member and urging the microfeature die and the support member toward each other to provide a first bond between the die and the support member via the solder. The method can still further include changing a phase of the solder to provide a second bond between the microfeature die and the support member, with the second bond being stronger than the first bond.

45 Claims, 6 Drawing Sheets

METHODS FOR ATTACHING MICROFEATURE DIES TO EXTERNAL DEVICES

TECHNICAL FIELD

The present disclosure is directed to methods for attaching microfeature dies to external devices, including support members and/or other microfeature dies. The methods can include forming an initial bond followed by a stronger subsequent bond.

BACKGROUND

Packaged microelectronic assemblies, such as memory chips and microprocessor chips, typically include a microfeature die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

In one conventional arrangement, microelectronic dies are attached to other microelectronic dies, interposer boards, or other support substrates using solder balls. Small balls of solder are attached to bond pads located at the surface of the die using a reflow process. The die, along with the attached solder balls, is then positioned over the support substrate so that the solder balls are aligned with corresponding bond pads at the surface of the support substrate. The support substrate can include a no-flow underfill material containing a flux to facilitate the electrical connection between the bond pads and the solder balls, and an epoxy to facilitate the physical connection between the support substrate and the die. The die and support substrate are then brought toward each other such that the solder balls carried by the die contact the bond pads carried by the support substrate. A subsequent reflow process is then used to fuse the solder balls to the support substrate bond pads.

One potential drawback with the foregoing approach is that not all the solder balls may make contact with the corresponding bond pads at the support substrate. For example, some of the solder balls may be misshapen or smaller than normal, and accordingly a gap may exist between these solder balls and the corresponding bond pads. During the reflow process, this gap may not seal, and the result may be an open circuit between the die bond pad and the corresponding support substrate bond pad.

Another potential drawback with the foregoing approach is that it may result in a vulnerable mechanical connection between the die and the support substrate. For example, when the die with pre-attached solder balls is brought into contact with the support substrate, air bubbles may become trapped between the lower surface of the die and the upper surface of the underfill material. During subsequent high temperature processes, the air trapped in this region may expand and force the die away from the support substrate, damaging the mechanical and/or electrical connections between these components.

In another conventional arrangement, flux is applied to the support substrate bond pads, in the absence of a no-flow underfill material, to facilitate the electrical connection between the bond pads carried by the support substrate, and the solder balls carried by the die. After the solder balls have been reflowed to establish this connection, a capillary underfill material is applied to fill in the interstices between the die and the support substrate. One drawback with this approach is that it requires the application of flux to the substrate bond pads, which increases processing time. Another drawback is that residual flux can affect the ability of the capillary underfill material to adhere to the die and the substrate. Accordingly, the substrate must be cleaned prior to applying the underfill material, which further increases the processing time.

In light of the foregoing potential drawbacks, existing processes may create at least some faulty packaged dies. In order to increase the efficiency and overall throughput of the manufacturing process for such dies, it is desirable to increase the robustness of both the mechanical and electrical connections between microfeature dies and the structures to which they are attached.

DETAILED DESCRIPTION

The present disclosure is directed to methods for attaching microfeature dies to external devices, including support members and/or other microfeature dies. As used herein, the terms "microfeature workpiece," "microfeature die," and "workpiece" will refer to substrates in and/or on which microelectronic devices are integrally formed. Typical devices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. Substrates can be semiconductive pieces (e.g., doped silicon wafers or galium arsenide wafers), non-conductive pieces (e.g., various ceramic substrates), or conductive pieces. In some cases, the workpieces are generally round, and in other cases the workpieces have other shapes, including rectilinear shapes. Several embodiments of techniques for attaching dies formed from such workpieces are described below. A person skilled in the relevant art will understand, however, that the invention may have additional embodiments, and that the invention may be practiced without several of the details of the embodiments described below with reference to FIGS. 1A-3D.

Figure 1A:
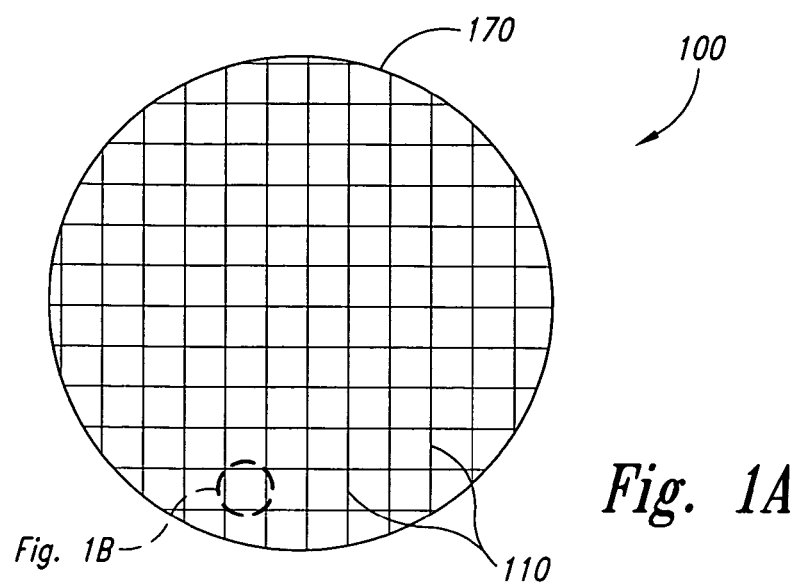
FIGS. 1A-1C illustrate microfeature workpieces and systems that can include features in accordance with several embodiments of the invention.

FIG. 1A illustrates a microfeature workpiece 100 in the form of a wafer 170 that includes multiple microfeature dies 110. In some cases, some of the processes described below may be conducted on the microfeature workpiece 100 at the wafer level, and other processes may be conducted on the individual microfeature dies 110 of the microfeature workpiece 100 after the dies 110 have been singulated from the larger wafer 170. Accordingly, unless otherwise noted, structures and methods described below in the context of a "microfeature workpiece" can apply to the wafer 170, the dies 110 that are formed from the wafer 170, and/or an assembly of one or more dies attached to a support member.

Figure 1B:
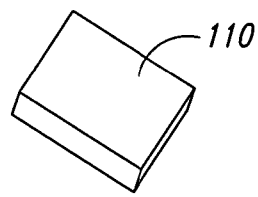

FIG. 1B is a schematic illustration of an individual die 110 after it has been singulated from the wafer 170 shown in FIG. 1A. The die 110 can include operable microelectronic structures, optionally encased within a protective encapsulant. Pins, bond pads, solder balls, redistribution structures, and/or other conductive structures provide electrical communication between structures within the die 110 and structures/devices located external to the die.

Figure 1C:
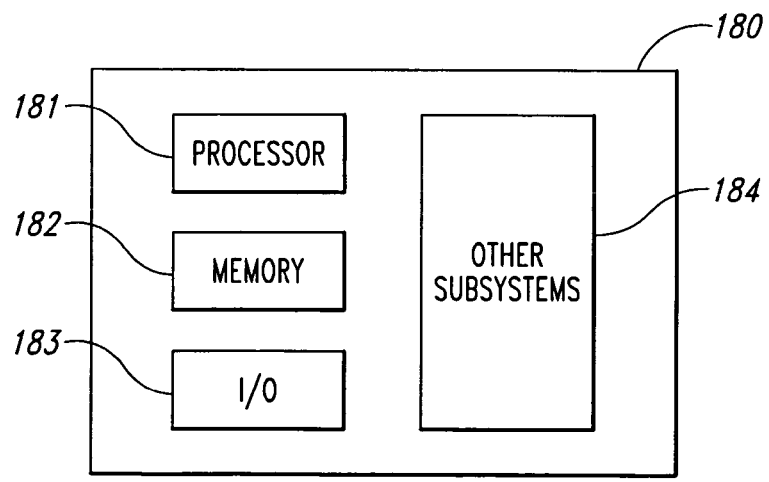

Individual dies 110 may be incorporated into any of a myriad of larger and/or more complex systems 180, a representative one of which is shown schematically in FIG. 1C. The system 180 can include a processor 181, a memory 182 (e.g., SRAM, DRAM, Flash, and/or other memory device), input/output devices 183, and/or other subsystems or components 184. Microfeature workpieces (e.g., in the form of microfeature dies and/or combinations of microfeature dies) may be included in any of the components shown in FIG. 1C. The resulting system 180 can perform any of a wide variety of computing, processing, storage, sensor and/or other functions. Accordingly, representative systems 180 include, without limitation, computers and/or other data processors, for example, desktop computers, laptop computers, Internet appliances, hand-held devices (e.g., palm-top computers, wearable computers, cellular or mobile phones, and personal digital assistants), multi-processor systems, processor-based or programmable consumer electronics, network computers, and mini computers. Other representative systems 180 include cameras, light or other radiation sensors, servers and associated server subsystems, display devices, and/or memory devices. Components of the system 180 may be housed in a single unit or distributed over multiple, interconnected units, e.g., through a communications network. Components can accordingly include local and/or remote memory storage devices, and any of a wide variety of computer-readable media.

Figure 2A:
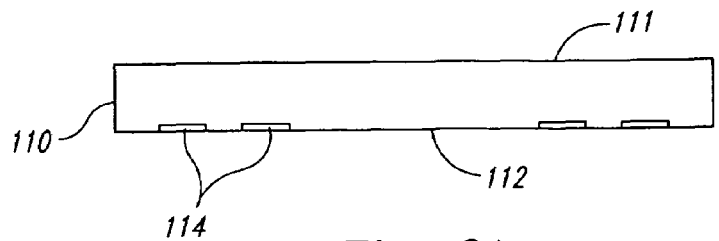
FIGS. 2A-2G illustrate a process for connecting a microfeature die to a support member in accordance with several embodiments of the invention.

FIG. 2A is a partially schematic illustration of a microfeature die 110 suitable for an attachment process in accordance with an embodiment of the invention. The microfeature die 110 has been singulated from a larger workpiece that includes multiple additional dies. For purposes of illustration, the following processes are described in the context of a single microfeature die 110, though in other embodiments, multiple dies may undergo at least some of these processes simultaneously, prior to being singulated.

The microfeature die 110 shown in FIG. 2A includes a first surface 111, a second surface 112 facing opposite from the first surface 111, and die bond pads 114 accessible from the second surface 112. The die bond pads 114 are electrically connected to internal features within the die 110 and accordingly provide electrical communication between these features and other devices located external to the die 110. In particular embodiments, solder or another suitable, re-flowable conductive material is used to provide the connection between the die 110 and other devices, as is described in greater detail below.

Figure 2B:
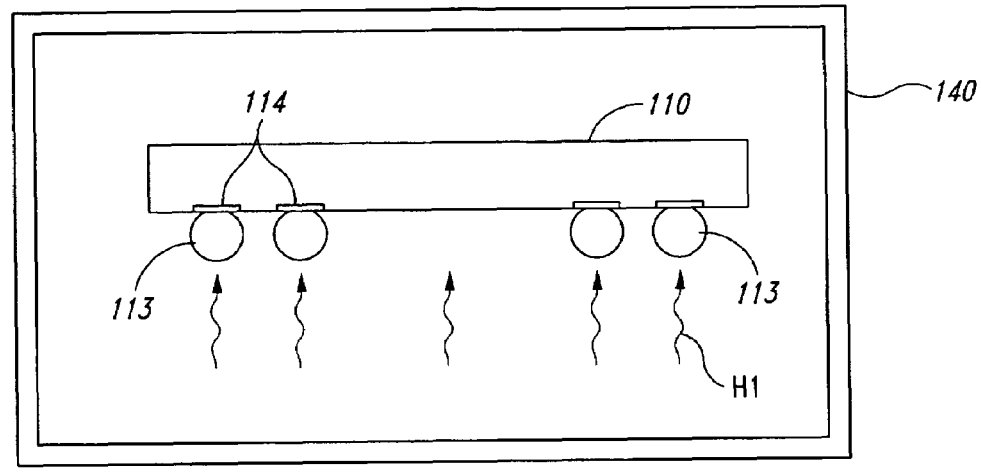

FIG. 2B illustrates the microfeature die 110 with discrete volumes of solder 113 attached to the corresponding die bond pads 114. As shown in FIG. 2B, the solder 113 can be in the form of individual solder balls, with one solder ball applied to each of the corresponding die bond pads 114. The solder balls 113 may contact a volume of flux at the die pads 114. The die 110 with the attached solder balls 113 is then placed in a reflow chamber 114 where heat (represented by arrows H1) is applied to the die 110 to reflow the solder balls 113 and provide a robust connection between the solder balls 113 and the microfeature die 110. In another embodiment, the die bond pads 114 need not include flux, and a laser or other process can be used to reflow the solder balls 114. In either arrangement, the phase of the solder balls 113 is changed (e.g., from a solid to a liquid, then back to a solid) to facilitate the more robust connection.

Figure 2C:
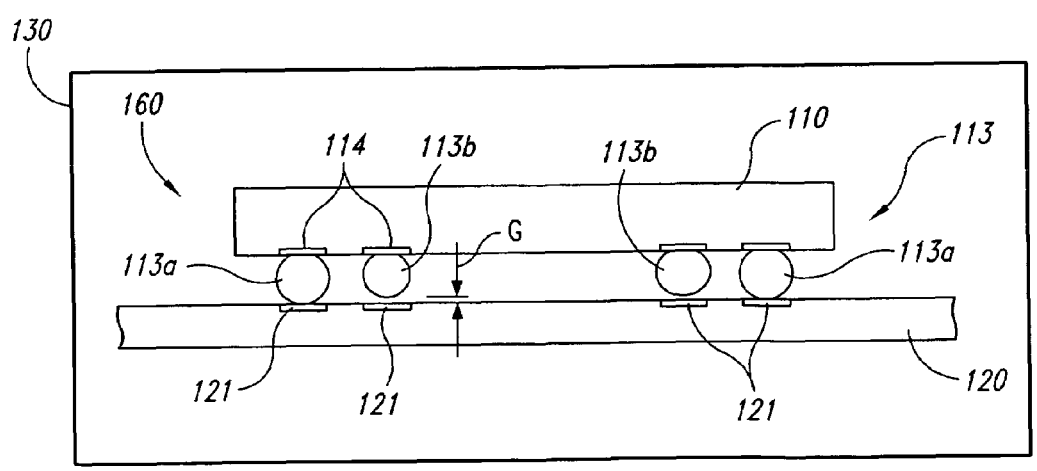

After the phase change process shown in FIG. 2B, the microfeature die 110 is positioned proximate to a support member 120 or other device, as is shown in FIG. 2C. The support member 120 can include an interposer board, another type of circuit board, or any suitable device having electrical connections for bonding to the solder balls 113. Accordingly, the support member 120 can be used to route electrical signals to and from the microfeature die 110. The support member 120 can include support member bond pads 121 positioned to align with the corresponding solder balls 113 of the microfeature die 110.

The microfeature die 110 is brought into contact with the support member 120 to form an assembly 160. The support member 120 and the microfeature die 110 may be brought into contact with each other in a tack chamber 130 which optionally has a controlled environment. For example, the tack chamber 130 may be filled with an inert gas (e.g., helium or nitrogen) to prevent oxidation or at least further oxidation of the components placed in it. At least some of the solder balls (e.g., first solder balls 113*a*) make physical contact with the corresponding support member bond pads 121. The support member bond pads 121 may be pre-tinned, but need not include a flux, a solder paste, or another substance that is at least partially flowable at room temperature. Accordingly, the support member bond pads 121 can include a relatively thin layer of solder that is not flowable at room temperatures.

As is also shown in FIG. 2C, other solder balls (e.g., second solder balls 113*b*) may not make contact with the corresponding support member bond pads 121 and may accordingly be spaced apart from the support member bond pads 121 by a gap G. Unlike at least some prior art techniques, embodiments of the current technique can be used to close the gap G and provide for consistent and robust electrical contact between even the second solder balls 113*b* and the corresponding support member bond pads 121.

Figure 2D:
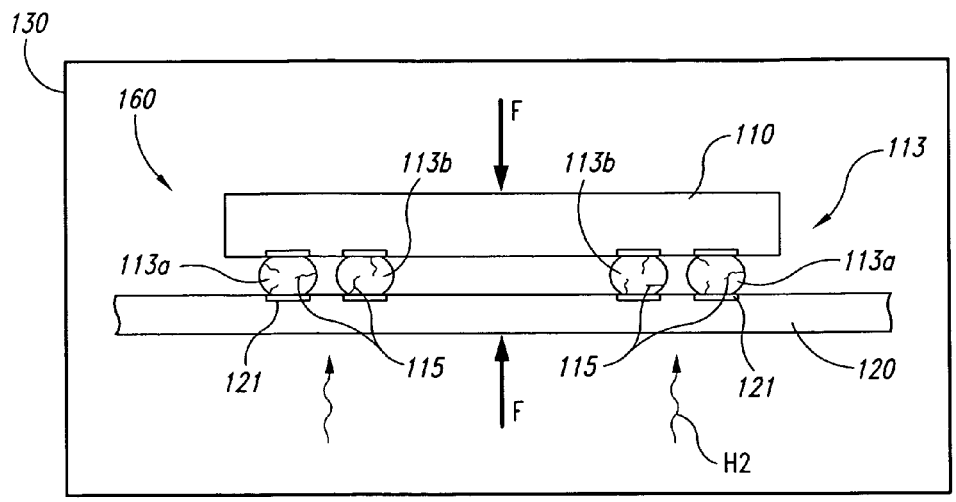

FIG. 2D illustrates a process for providing an initial bond between the solder balls 113 (both the first solder balls 113*a* and the second solder balls 113*b*) and closing the gaps G between the second solder balls 113*b* and the corresponding support member bond pads 121. In the tack chamber 130, the support member 120 and the microfeature die 110 are urged toward each other, as indicated by arrows F. As used herein, urging the support member and the microfeature die "toward each other" can include supporting support member 120 while the microfeature die 110 is urged toward it, supporting the microfeature die 110 while the support member 120 is urged toward it, or urging both the microfeature die 110 and the support member 120 toward each other.

The amount of movement and/or deflection experienced by the support member 120 and/or the microfeature die 110 as these components are urged toward each other is expected to be small or non-existent; however, the solder balls 113 may undergo more significant change. For example, urging these components toward each other can close the gap G shown in FIG. 2C, so that all or at least an increased number of the solder balls 113 are in physical contact with the corresponding support member bond pads 121. Another effect that may be produced by urging these components toward each other is that the solder balls 113 can change shape, deform, and/or otherwise undergo a physical change as a result of the applied force. The first solder balls 113*a*, which were initially in contact with their corresponding support member bond pads 121, may undergo a greater change than the second solder balls 113b, which were initially spaced apart from their corresponding support member bond pads 121 by the gap G.

The change in shape and/or other deformation of the solder balls 113, including both the first solder balls 113a and the second solder balls 113b, can produce cracks 115 or other disturbances at the surfaces of the solder balls 113. In particular, the cracks 115 can form in an oxide layer that is typically present at the outside of the solder balls 113. The cracks 115 produced in the surface of the solder balls 113 can expose "fresh" solder material from within the solder balls 113, which, due to the force applied to the microfeature die 110 and the support member 120, can come into direct contact with the corresponding support member bond pads 121. If the support member bond pads 121 also include an oxide layer (which may be the case, for example, if the support member bond pads 121 are pre-tinned), then the applied force can also produce cracks or other disturbances in the pad-borne oxide layer, exposing unoxidized material below. As a result of the direct contact between unoxidized portions of the solder balls 113 and the support member bond pads 121, an initial bond (e.g., a tack weld) is expected to form between the solder balls 113 and the support member bond pads 121. This initial bond is expected to be weaker than a bond that results from reflowing the solder balls 113, but is expected to be strong enough to maintain the positional alignment between the support member 120 and the microfeature die 110 during subsequent processes. The subsequent processes can include (but are not limited to) moving the support member 120 and the die 110 as a unit to a reflow chamber.

In at least some embodiments, the environment within the tack chamber 130 can be at room temperature while the microfeature workpiece 110 and the support member 120 are urged toward each other. In other embodiments, the temperature within the tack chamber 130 can be elevated to be above room temperature, but below the reflow or melting temperature of the solder balls 113. For example, tin/silver solder balls typically melt at a temperature of about 216-217° C. The heat applied in the tack chamber 130 (represented by arrows H2) can elevate the temperature of the solder balls 113 to be within the range of about 150° C. to about 180° C. Elevating the temperature to a value in this range is expected to increase the strength of the initial bond (e.g., the tack weld) formed between the solder balls 113 and the support member 120, without actually reflowing the solder balls 113.

The temperature in the tack chamber 130 and the urging force applied to the support member 120 and/or the microfeature workpiece 110 can be selected in a coordinated manner. For example, the temperature and the urging force may be inversely proportional to each other in one embodiment. That is, it is expected that the higher the temperature in the tack chamber 130, the lower the urging force necessary to produce an initial bond of suitable strength.

The urging force can depend on the make-up of the solder balls 113 and/or the number of solder balls 113 between the microfeature die 110 and the support member 120. For example, when the solder balls 113 include a typical tin/silver alloy and have a diameter of about 80 microns, the urging force can be from about 0.02 Newtons per solder ball 113 to about 0.10 Newtons per solder ball 113. Accordingly, a microfeature die 110 with approximately one hundred (e.g., 110) such solder balls 113 can have a force of from about 2.0 Newtons to about 10.0 Newtons applied to it. In other embodiments, the urging force can have other values.

Figure 2E:
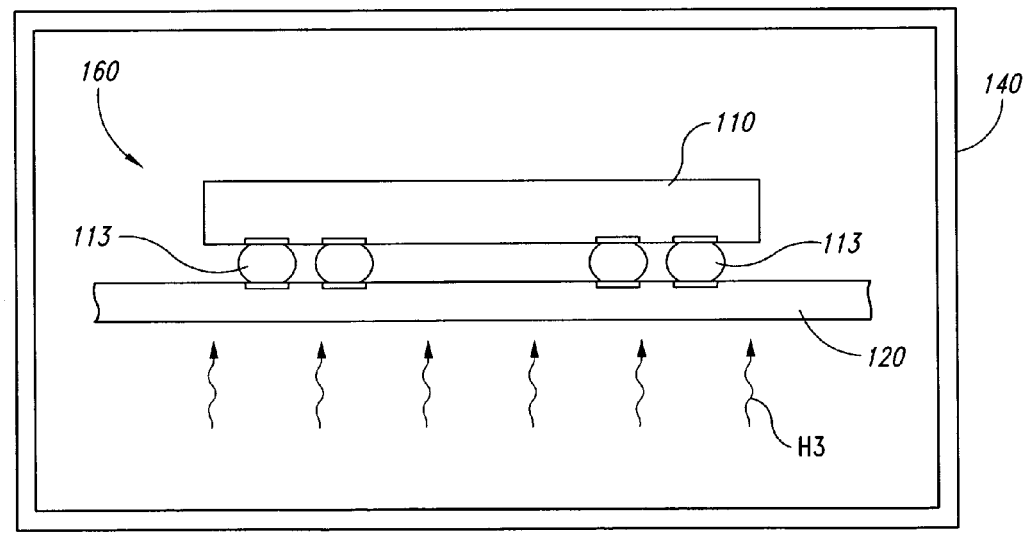

After the initial bond is formed using the process shown in FIG. 2D, the assembly 160 of the microfeature die 110 and the support member 120 may be moved about using a conventional pick-and-place robot. The pick-and-place robot can move the assembly 160 to other processing stations where other packaging processes, including reflow processes are performed. Accordingly, FIG. 2E illustrates the assembly 160 placed in the reflow chamber 140 after the initial bond has been formed. Heat is applied to the assembly 100 (represented by arrows H3) to reflow the solder balls 113 at a temperature higher than that provided in the tack chamber 130. The reflowed solder balls 113 can provide a more robust and permanent connection between the microfeature die 110 and the support member 120. In particular embodiments, it is expected that the second bond will be stronger than the first bond by virtue of the phase change undergone by the solder balls 113 during the formation of the second bond.

Figure 2F:
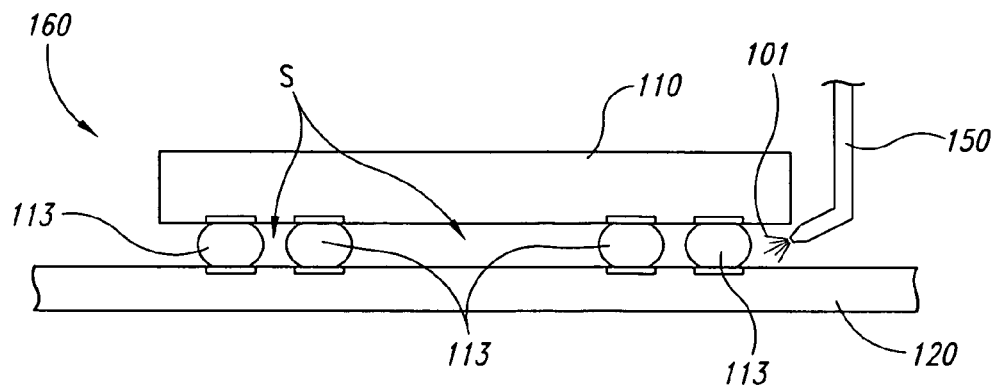
Figure 2G:
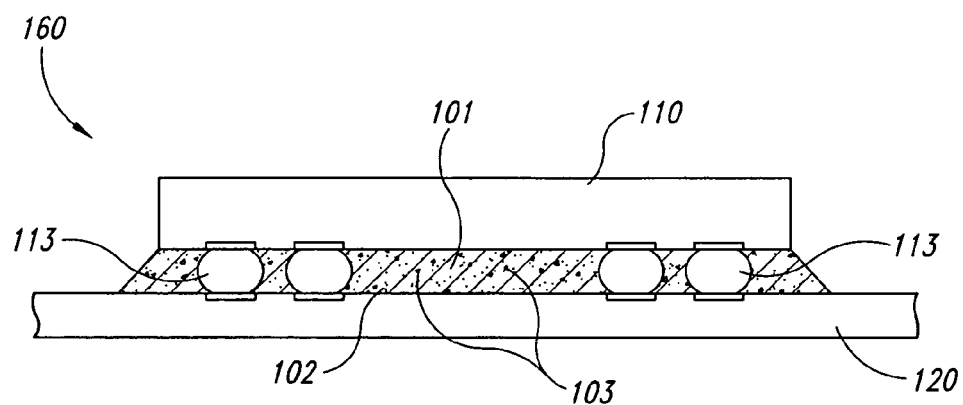

FIG. 2F illustrates a process for applying an (optional) underfill material 101 to the assembly 160. The underfill material 101 can protect the connection formed between the microfeature die 110 and the support member 120 by the solder balls 113, and can prevent contaminants from entering the interstitial spaces S between these components. In a particular embodiment, a capillary underfill material 101 is applied adjacent to the microfeature die 110 using an underfill applicator 150 (shown schematically in FIG. 2F). The underfill material 101 wicks into the spaces S between the microfeature die 110 and the support member 120, forcing out air within the spaces S as it does so. FIG. 2G illustrates the assembly 160 after the underfill material 101 has been wicked into the spaces S between the microfeature die 110 and the support member 120. The underfill material 101 can include a matrix material 102 and filler elements 103 distributed within the matrix material 102.

An embodiment of the method described above with reference to FIGS. 2A-2G includes changing a phase of a volume of solder to attach the solder to the microfeature die 110 or the support member 120. The method can further include contacting the solder with the other one of the microfeature die 110 and the support member 120, and urging the microfeature die 110 and the support member 120 toward each other to provide a first bond between the microfeature die 110 and the support member 120 via the solder. For example, the first bond can include a tack weld between the microfeature die 110 and the support member 120. The method can still further include changing a phase of the solder to provide a second bond between the microfeature die 110 and the support member 120, with the second bond being stronger than the first bond. In a particular embodiment, the second bond can be created using a reflow process.

It is expected that urging the microfeature die 110 and the support member 120 toward each other can eliminate gaps between the second solder balls 113b and the support member bond pads 121, thereby reducing or eliminating the likelihood for open electrical connections between these components. Urging the microfeature die 110 and the support member 120 toward each other can also deform the solder balls 113, which can in turn crack or otherwise disturb an oxide layer at the outside of the solder balls 113. As a result, it is expected that "fresh," (e.g., non-oxide coated) solder can come into direct contact with the support member bond pads 121. This in turn can produce an initial bond between the microfeature die 110 and the support member 120.

The bond formed between the microfeature die 110 and the support member 120 can be formed without the use of a flux at the interface between the solder balls 113 and the support member bond pads 121, either during formation of the initial tack bond or during formation of a subsequent reflowed bond. Accordingly, this arrangement can eliminate at least one step in the formation of the assembly 160 (e.g., the step of applying or using a flux, such as a tacky flux or other flux at the interface between the solder balls 113 and the support member bond pads 121). In addition, the initial bond between the microfeature die 110 and support member 120 can allow the assembly 160 to be moved prior to reflowing the solder balls 113. Accordingly, the number of machines suitable for forming a fluxless connection between the microfeature die 110 and the support member 120 can be increased, allowing the manufacturer additional flexibility. For example, some machines (e.g., such as are available from Sysmelec of Gals, Switzerland) can produce a fluxless bond using a robot with an on-board reflow device. However, using techniques such as those described above with reference to FIGS. 2A-2G, fluxless bonds can be effectively produced without reliance on this particular type of machine. Instead, a sufficiently strong initial bond (e.g. a tack weld) can allow the assembly 160 to be moved to and reflowed in an existing reflow chamber, without requiring specialized on-board tooling.

If an optional underfill material 101 is applied to the interface between the microfeature die 110 and the support member 120, it can be applied after the reflowed solder ball connection is formed between these two components. For example, a capillary underfill material 101 can be wicked into the interstitial spaces S between these components so as to reduce the likelihood for leaving air bubbles in the spaces. Air bubbles are less likely to be trapped in the interstitial spaces S when the underfill material 101 is wicked into the spaces so that air in the spaces is forced out ahead of the advancing underfill material than when the microfeature die 110 is brought into face-to-face contact with an existing volume of underfill material.

Capillary underfill materials 101 can also include filler elements 103, which are expected to improve the reliability of the bond between the die 110 and the support member 120. In particular, the filler elements 103 can have a lower coefficient of thermal expansion (CTE), one that more closely matches the CTE of the support member 120 and/or the microfeature die 110. A closer CTE "match" between the underfill material 101 and the components it is placed between is expected to reduce the likelihood for these components to delaminate when exposed to elemental temperatures. However, if such a material 101 is applied in a no-flow process, the filler elements 103 can become trapped between the support member 120 and the microfeature die 110. That is, the filler elements 103 may create a "tent pole" effect, and may be oriented in such a way as to prevent the microfeature die 110 from coming close enough to the support member 120 to allow all the solder balls 113 to contact the corresponding support member bond pads 121. However, by flowing the underfill material 101 into the space between the microfeature die 110 and the support member 120 after the relative positions of these components is fixed, this drawback with filler elements 103 is expected to be eliminated.

FIGS. 2A-2G discussed above, illustrate a process for attaching a microfeature die 110 to a support member 120 in accordance with an embodiment of the invention. Similar techniques may be used to attach microfeature dies to other devices, including other microfeature dies. Accordingly, a method in accordance with an embodiment of the invention includes attaching a microfeature die to bond pads of another device by positioning the microfeature die so that individual solder balls of the microfeature die face toward individual corresponding bond pads of the other device. Individual first solder balls can be in contact with individual corresponding bond pads toward which they face, and individual second solder balls can be spaced apart by a gap from individual corresponding bond pads toward which they face. The method can further include urging the microfeature die and the device toward each other to close the gaps between the second solder balls and the corresponding bond pads, and provide a first bond between the microfeature die and the bond pads of the other device via the solder balls. The method can still further include changing a phase of the solder balls to provide a second bond between the microfeature die and the device, with the second bond being stronger than the first bond. The device to which the microfeature die is attached can include another microfeature die, or a support member.

FIGS. 3A-3D schematically illustrate a representative process for stacking two, three, or more microfeature dies together, and optionally, for stacking the microfeature dies on a support member. Beginning with FIG. 3A, three microfeature dies 310, including a first microfeature die 310a, a second microfeature die 310b, and a third microfeature die 310c, can be electrically attached to each other in a stacked arrangement. Each of the microfeature dies 310 can include a first surface 111 from which first die bond pads 114a are accessible, and an oppositely facing second surface 112, from which oppositely facing second die bond pads 114b are accessible. In at least some cases, the first die bond pads 114a are electrically coupled to the second die bond pads 114b, for example, by way of a through-silicon or through-wafer via, or by other conductive paths. The presence of any of the bond pads 114a, 114b and/or the connections between bond pads 114a, 114b may vary from one die to another, in particular, in a manner that depends upon the position of the die in the stack. The first die bond pads 114a of one microfeature die 310 can be attached to the corresponding second die bond pads 114b of another of the microfeature dies 310 using solder balls 113. The solder balls 113 can be attached to the microfeature dies 310 using a reflow process (as described above with reference to FIG. 2B), or a tack weld followed by a reflow process. The solder balls 113 are then ready to be connected to the next microfeature die 310.

Figure 3A:
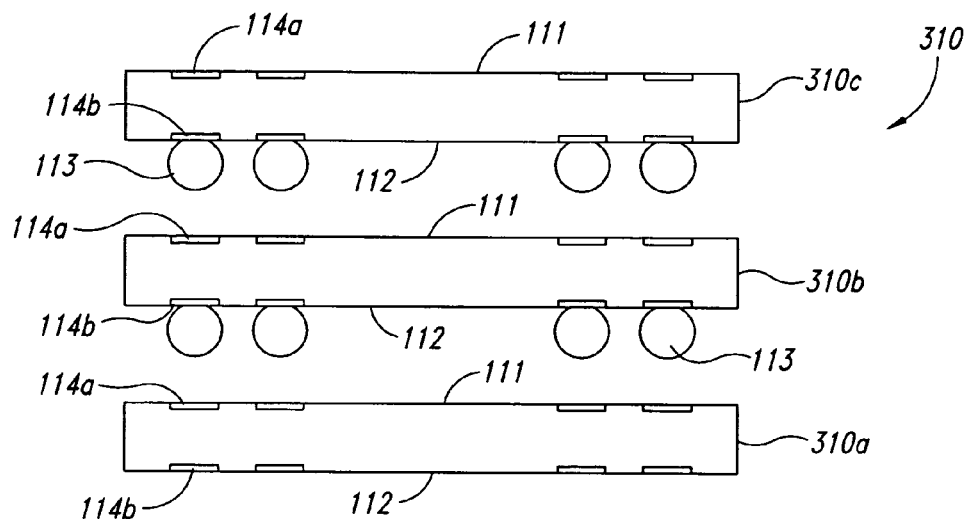
FIGS. 3A-3D illustrate a process for attaching multiple microfeature dies to each other in accordance with another embodiment of the invention.
Figure 3B:
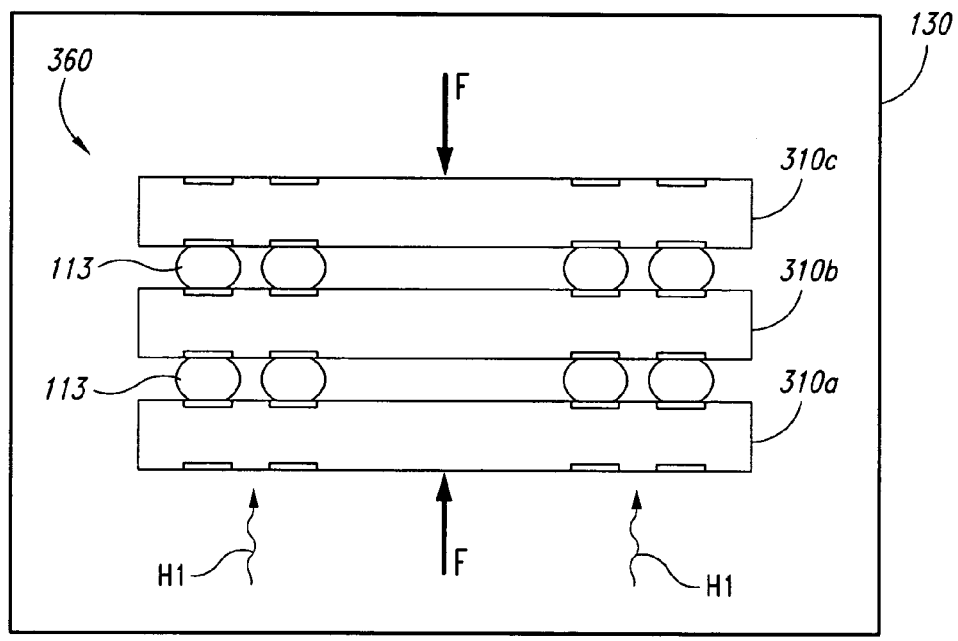
Figure 3C:
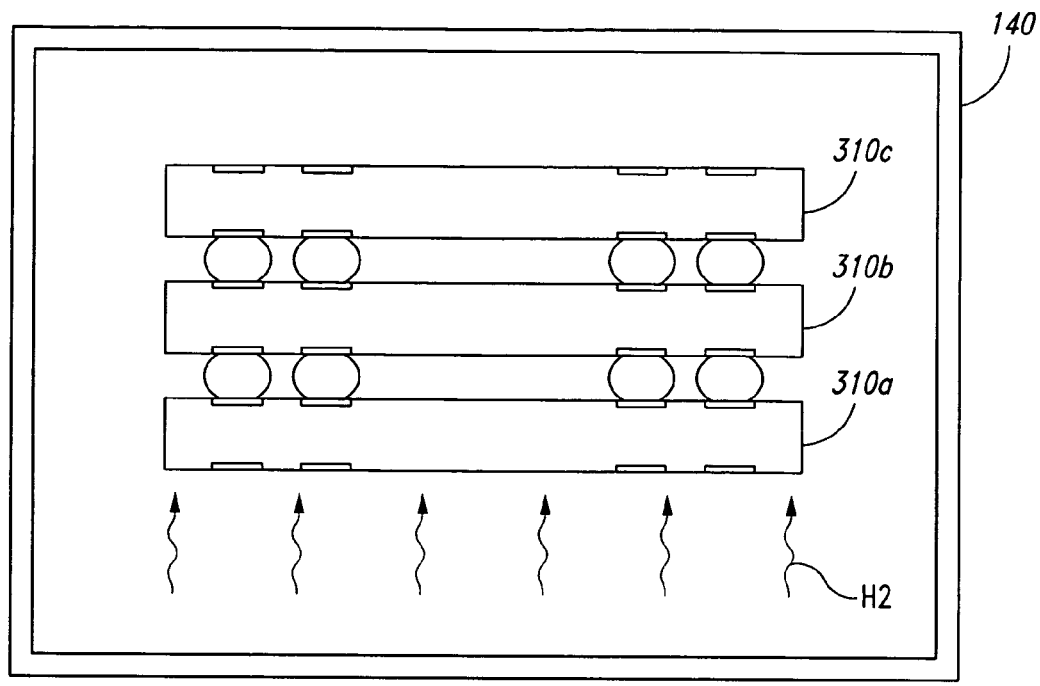
Figure 3D:
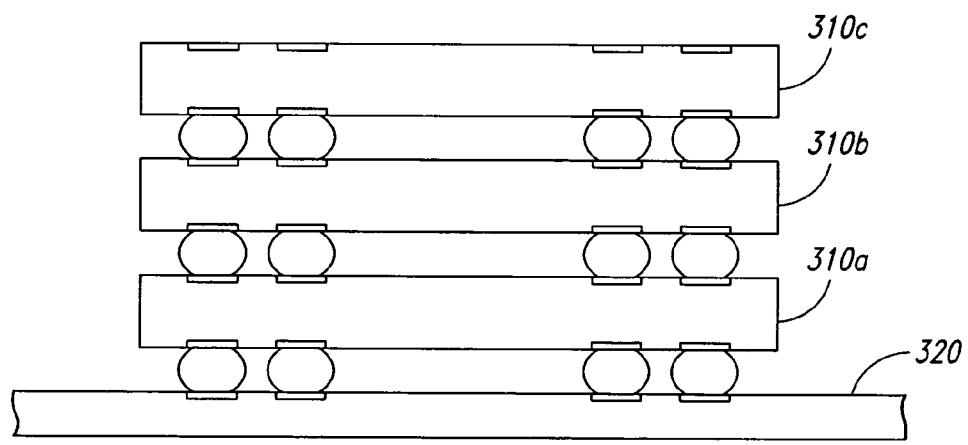

As shown in FIG. 3B, the solder balls 113 can initially be bonded to the corresponding bond pads of the next microfeature die 310 using the tack chamber 130 and a process generally similar to that described above with reference to FIG. 2D. After tacking, the resulting assembly 360 can be placed in the reflow chamber 140 (as shown in FIG. 3C) to undergo a reflow process, generally similar to that described above with reference to FIG. 2E. As shown in FIG. 3D, the reflowed assembly 360 can then be optionally positioned on a support member 320, either in an upright orientation (generally similar to that shown in FIG. 3C), or in an inverted orientation in which the third microfeature die 310c is positioned closest to the support member 320, and the first microfeature die 310a is positioned furthest away. A subsequent tack and/or reflow process can be used to attach the stack of microfeature dies 310 to the support member 320.

In other embodiments, the microfeature dies 310 can be stacked in other manners. For example, the stack can include more or fewer than three microfeature dies 310. The stack need not include the support member 320. The stack can be formed by attaching the first microfeature die 310a to the support member 320, then attaching the second microfeature die 310b to the first microfeature die 310a, and then attaching the third microfeature die 310c to the second microfeature die 310b, rather than attaching all the microfeature dies 310 to each other first before attaching them as a unit to the support member 320. In any of these embodiments, the reflow process can be performed on all the microfeature dies 310 at once, or separately as each microfeature die 310 is stacked on the other. In still further embodiments, the microfeature dies 310 can be tacked to each other simultaneously with being tacked to the support member 320, and/or the reflow process can be performed simultaneously on the connections between individual microfeature dies 310 and the connection between the stack and the support member 320.

From the foregoing, it will be appreciated that specific embodiments of the invention have been described herein for purposes of illustration, but that various modifications may be made without deviating from the invention. For example, solder may initially be attached to the microfeature die (as shown in the Figures) before being attached to the support member, or the solder may initially be attached to the support member. The solder may take the form of solder balls, or in at least some embodiments, may have other shapes. The solder can include a tin/silver alloy, or another composition suitable for providing an appropriate electrical connection as the result of a phase change. Accordingly, the invention is not limited except as by the appended claims.

I claim:

1. A method for forming a microelectronic assembly, comprising:
    attaching a microfeature die and a support member by:
        attaching a volume of solder to at least one of the microfeature die and the support member by changing a phase of the solder;
        contacting the solder with the other of the microfeature die and the support member;
        providing a first bond between the microfeature die and the support member via the solder by urging the microfeature die and the support member toward each other to form a tack weld with an urging force from about 0.02 Nt. to about 0.1 Nt. while the solder is at an elevated temperature from about 150° C. to about 180° C. and below a melting point of the solder; and
        providing a second bond between the microfeature die and the support member by changing a phase of the solder, the second bond being stronger than the first bond.

2. The method of claim 1 wherein providing a first bond includes forming the tack weld between the microfeature die and the support member via the solder by urging the microfeature die and the support member toward each other without a solder paste or a tacky flux being present on the microfeature die, on the support member, or in the solder.

3. The method of claim 2 wherein providing a first bond includes urging the microfeature die and the support member toward each other to form the tack weld with the urging force inversely proportional to the elevated temperature.

4. The method of claim 1 wherein urging the microfeature die and the support member is performed at a first temperature and wherein changing a phase of the solder to provide the second bond is performed at a second temperature higher than the first temperature.

5. The method of claim 1 wherein contacting the solder includes contacting the solder with a bond pad that does not include either solder paste or tacky flux.

6. The method of claim 1 wherein contacting the solder includes contacting the solder with a bond pad that does not carry a substance that is at least partially flowable at room temperature.

7. The method of claim 1 wherein contacting the solder includes contacting the solder without an underfill material present on the other of the microfeature die and the support member.

8. The method of claim 1, further comprising applying a non-conductive underfill material between the microfeature die and the support member after joining the microfeature die and the support member with the second bond.

9. The method of claim 8 wherein applying a non-conductive underfill material includes applying an underfill material that contains solid filler elements.

10. The method of claim 1 wherein contacting the solder includes contacting a solder ball attached to the microfeature die directly with a bond pad carried by the support member.

11. The method of claim 10 wherein contacting the solder includes contacting the solder with a pre-tinned bond pad.

12. The method of claim 1 wherein the solder includes at least one solder ball, and wherein urging includes urging with a force of from about 0.02 Nt. to about 0.1 Nt. per solder ball.

13. The method of claim 1 wherein the solder includes about 110 solder balls, each having a diameter of about 80 microns, and wherein urging includes urging with a force of from about 2 Nt. to about 10 Nt.

14. The method of claim 1, further comprising maintaining a positional alignment between the microfeature die and the support member with the tack weld during transport and before providing the second bond.

15. The method of claim 1 wherein changing a phase of the solder includes reflowing the solder.

16. The method of claim 1 wherein the solder is one of multiple solder balls, and wherein a number of the solder balls are spaced apart from the other of the microfeature die and the support member by a gap, and wherein urging includes closing the gap.

17. The method of claim 1 wherein attaching the microfeature die and the support member includes attaching the microfeature die and the support member without applying a flux to the microfeature die, the support member or the solder.

18. The method of claim 1 wherein urging includes changing a shape of the solder by forcing the microfeature die and the support member toward each other.

19. The method of claim 1 wherein urging includes disrupting an oxide at an outer surface of the solder by forcing the microfeature die and the support member toward each other.

20. The method of claim 19 wherein disrupting the oxide includes breaking the oxide and exposing a generally non-oxidized portion of the solder by forcing the microfeature die and the support member toward each other.

21. The method of claim 1 wherein urging includes disrupting an oxide at a bond pad surface against which the solder is urged.

22. The method of claim 1 wherein urging is performed in a generally inert environment.

23. The method of claim 1, further comprising moving the microfeature die and the support member as a unit after forming the first bond and before forming the second bond.

24. The method of claim 1, further comprising selecting one of an urging force and a temperature at which the urging force is applied, based at least in part on the other of the urging force and the temperature at which the urging force is applied.

25. The method of claim 1 wherein urging the microfeature die and the support member toward each other includes selecting a force for urging the microfeature die and the support member toward each other based at least in part on a value of the elevated temperature.

26. The method of claim 1 wherein urging the microfeature die and the support member toward each other includes selecting a force for urging the microfeature die and the support member toward each other, the force being inversely proportional to a value of the elevated temperature.

27. A method for forming a microelectronic assembly, comprising:
    attaching a microfeature die to bond pads of another device by:

positioning the microfeature die with individual solder balls of the microfeature die facing toward individual corresponding bond pads of the other device, and with individual first solder balls in contact with individual corresponding bond pads toward which they face, and with individual second solder balls spaced apart by a gap from individual corresponding bond pads toward which they face; and urging the microfeature die and the device toward each other with an urging force from about 0.02 Nt. to about 0.1 Nt. per solder ball while the first and second solder balls are at an elevated temperature from about 150° C. to about 180° C. and below a melting point of the solder to close the gaps between the second solder balls and the corresponding bond pads, and provide a bond between the microfeature die and the bond pads via the first and second solder balls, the bond including a tack weld.

28. The method of claim 27 wherein the bond is a first bond, and wherein the method further comprises changing a phase of the solder balls to provide a second bond between the microfeature die and the device, the second bond being stronger than the first bond.

29. The method of claim 27 wherein attaching a microfeature die to bond pads of another device includes attaching a first microfeature die to bond pads of a second microfeature die.

30. The method of claim 27 wherein attaching a microfeature die to bond pads of another device includes attaching a microfeature die to bond pads of a support member.

31. The method of claim 27, further comprising applying the multiple solder balls to the microfeature die prior to urging the microfeature die and the device toward each other.

32. A method for forming a microelectronic assembly, comprising:
attaching a first microfeature die to a second microfeature die by:
applying solder to at least one of the first and second microfeature dies;
positioning the first and second microfeature dies proximate to each other with the solder in contact with both the first and second microfeature dies;
urging at least one of the first and second microfeature dies toward the other to provide a first bond between the first and second microfeature dies with an urging force from about 0.02 Nt. to about 0.1 Nt. while the solder is at an elevated temperature from about 150° C. to about 180° C. and below a melting point of the solder, the first bond including a tack weld; and
changing a phase of the solder to provide a second bond between the first and second microfeature dies, the second bond being stronger than the first bond.

33. The method of claim 32, further comprising attaching the first microfeature die to a support member.

34. The method of claim 33 wherein attaching the first microfeature die to the second microfeature die is performed before attaching the first microfeature die to the support member.

35. The method of claim 33 wherein attaching the first microfeature die to the second microfeature die is performed after attaching the first microfeature die to the support member.

36. The method of claim 33 wherein the solder is a first volume of solder and wherein the method further comprises attaching the first microfeature die to a support member by:
applying a second volume of solder to at least one of the first microfeature die and the support member;
positioning the first microfeature die and the support member proximate to each other with the second volume of solder in contact with both the first microfeature die and the support member;
urging at least one of the first microfeature die and the support member toward the other to provide a third bond between the first microfeature die and the support member; and
changing a phase of the second volume of solder to provide a fourth bond between the first microfeature die and the support member, the fourth bond being stronger than the third bond.

37. The method of claim 32, further comprising:
positioning a third microfeature die proximate to the second microfeature die with solder carried by the third microfeature die in contact with the second microfeature die;
urging at least one of the second and third microfeature dies toward the other to provide a third bond between the first and second microfeature dies; and
changing a phase of the solder between the second and third microfeature dies to provide a fourth bond between the second and third microfeature dies, the fourth bond being stronger than the third bond.

38. The method of claim 37, further comprising reflowing the solder between the first and second dies simultaneously with reflowing the solder between the second and third dies.

39. The method of claim 32 wherein applying the solder includes applying the solder to a bond site and changing a phase of the solder to attach the solder to the bond site.

40. The method of claim 32 where urging includes urging at least one of the first and second microfeature dies toward the other while the solder is at an elevated temperature above room temperature and below a melting point of the solder.

41. A method for forming a microelectronic assembly, comprising:
attaching a first microfeature die to a second microfeature die by:
positioning the second microfeature die with individual solder balls of the second microfeature die facing toward individual corresponding bond pads of the first microfeature die, with individual first solder balls in contact with individual corresponding bond pads toward which they face, and with individual second solder balls spaced apart by a gap from individual corresponding bond pads toward which they face;
urging the first and second microfeature dies toward each other with a force of from about 0.02 Nt. to about 0.1 Nt. per solder ball and at a temperature from about 150° C. to about 180° C. and below a melting point of the solder;
as the first and second microfeature dies are urged toward each other:
closing the gaps between the second solder balls and the corresponding bond pads;
disrupting an oxide at an outer surface of the solder balls;
changing a shape of the solder balls; and
forming a first bond between the microfeature die and the bond pads via the solder balls, without a solder paste or a tacky flux being present on the bond pads or in the solder balls; and
changing a phase of the solder balls to provide a second bond between the first and second microfeature dies, the second bond being stronger than the first bond, wherein the first bond includes a tack weld strong enough to maintain positional alignment between the first and second microfeature dies during transport before changing the phase of the solder balls to provide the second bond.

42. The method of claim 41, wherein urging the first and second microfeature dies toward each other includes urging the first and second microfeature dies toward each other with a force of from about 0.02 Nt. to about 0.1 Nt. per solder ball and at a temperature from about 150° C. to about 180° C. and below a melting point of the solder, the force being inversely proportional to the elevated temperature.

43. The method of claim 41, further comprising applying a non-conductive underfill material between the first and second microfeature dies after joining the first and second microfeature dies with the second bond.

44. The method of claim 43 wherein applying a non-conductive underfill material includes applying an underfill material that contains solid filler elements.

45. The method of claim 41 wherein urging includes selecting a force for urging the first and second microfeature dies toward each other based at least in part on a value of the elevated temperature.

* * * * *